Jan. 30, 1951 — J. B. HARLEY ET AL — 2,539,537

MULTIFREQUENCY COMBINED RADIO TRANSMITTER AND RECEIVER

Filed April 29, 1949 — 2 Sheets-Sheet 1

INVENTORS J. B. HARLEY
J. G. NORDAHL
BY G H Stevenson
ATTORNEY

Jan. 30, 1951 J. B. HARLEY ET AL 2,539,537

MULTIFREQUENCY COMBINED RADIO TRANSMITTER AND RECEIVER

Filed April 29, 1949 2 Sheets-Sheet 2

INVENTORS J. B. HARLEY
J. G. NORDAHL
BY G. H. Stevenson
ATTORNEY

Patented Jan. 30, 1951 2,539,537

UNITED STATES PATENT OFFICE 2,539,537

MULTIFREQUENCY COMBINED RADIO TRANSMITTER AND RECEIVER

John B. Harley, Valley Stream, N. Y., and John G. Nordahl, Summit, N. J., assignors to Bell Telephone Laboratories, Incorporated, New York, N. Y., a corporation of New York Application April 29, 1949, Serial No. 90,374

3 Claims. (Cl. 250—13)

Figure 1:
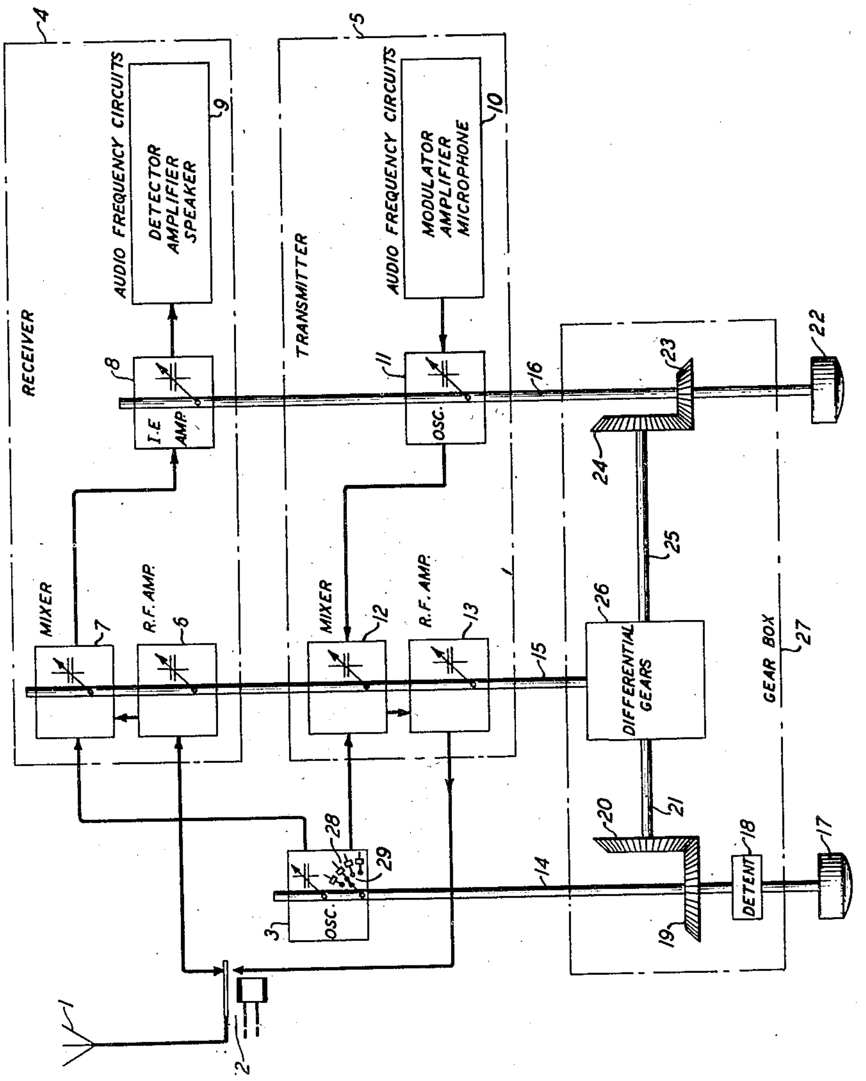

This invention relates to improved multifrequency transmitting and receiving apparatus arranged to transmit and receive signals on carrier waves of the same frequency.

A principal object of the invention is to simplify the tuning of radio sets arranged to operate at any one of a multiplicity of frequencies.

Another object is to reduce the number of adjustments to be made in coordinating the tuning of the transmitter and the receiver in combined transmitter and receiver sets.

A further object is to permit the establishment of a large number of operating frequencies by means of a relatively small number of piezoelectric crystals.

In superheterodyne transmitter-receiver sets it is necessary to tune different portions to different frequencies. When a large number of operating frequencies are used, it is generally necessary to make several adjustments in shifting from one frequency to another. A feature of this invention is and arrangement whereby the tuning of two heterodyne oscillators in the set to given frequencies simultaneously causes all the other tunable circuits of the transmitter and the receiver to be tuned to their proper frequencies. Another feature is the use of mechanically interconnected tuning controls to effect the tuning of the various parts of the system in coarse and fine steps, respectively.

The invention is particularly applicable to transmitter-receiver sets which utilize the same frequency for both transmitting and receiving. In applying the invention to a set of this character, wherein the operating frequency may be designated $f_0$, two mixing oscillators are provided, one being a high-frequency oscillator of frequency $f_1$, which is common to both transmitter and receiver, and the other an oscillator of lower frequency $f_2$, which is a part of the transmitter. The high-frequency oscillator is crystal controlled and its frequency is adjustable over the operating range in 1-megacycle steps only, by means of a switch which selects the proper crystal for the chosen carrier frequency. The crystal-selecting switch is operated, either directly or indirectly, by a tuning knob provided on the panel. The frequency of the other oscillator is either continuously adjustable or adjustable in 0.1-megacycle steps, over a total range of 1 megacycle only, by means of a second tuning knob.

When transmitting, the voice-modulated waves of the transmitter oscillator are combined in a transmitter mixer with waves from the common high-frequency oscillator, and the sum frequency $f_1+f_2=f_0$ is selected for transmission. Before delivery to the antenna the sum frequency waves are amplified by a high-frequency power amplifier. This amplifier is tuned to $f_0$ by the combined action of the two tuning knobs. The first knob, which selects the proper crystal, also tunes the amplifier in steps of 1 megacycle, the steps being governed by a detent mechanism associated with this knob, but for fractions of a megacycle between these steps a fine adjustment is made by the second tuning knob, in a manner to be explained. If desired, the fractional adjustments may be limited to tenths of a megacycle by means of a detent mechanism associated with the second tuning knob.

When receiving, the incoming waves of frequency $f_0$ are first amplified by a radio-frequency amplifier tuned to this frequency. One of the features of the invention is that this amplifier is simultaneously tuned in its coarse adjustment, in 1-megacycle steps, by the same control knob that effects the coarse tuning adjustment of the transmitter high-frequency amplifier. After amplification, the waves are combined in a receiver mixer with waves from the high-frequency oscillator to obtain an intermediate frequency, this being the difference frequency $f_0-f_1$, which is the frequency $f_2$ of the transmitter oscillator. The difference frequency waves are then amplified by an intermediate frequency amplifier tuned to $f_2$, after which they may be detected in the usual manner, or, if desired, heterodyned down to a still lower intermediate frequency before detection, in which case a third mixing oscillator is provided.

Another feature of the invention is that the intermediate frequency amplifier is simultaneously tuned, over its 1-megacycle range, by the same control knob that tunes the low-frequency amplifier of the transmitter. Still another important feature is that the fine adjustment of the transmitter and receiver high-frequency amplifiers is simultaneously made by the same control knob that makes the fractional megacycle adjustment of the transmitter oscillator and the receiver intermediate frequency amplifier, this being accomplished by means of a system of interconnecting gears. The gearing is so designed, however, that the crystal selection is not affected by this fine adjustment. Thus the ultimate result is that all the tunable circuits of both transmitter and receiver are correctly tuned to the operating frequency by the setting of the two controls.

The economy in the use of crystals which is afforded by the invention is apparent when it is noted that only one crystal is required for each megacycle step. For example, in a model set designed and constructed to cover a range from 20 to 28 megacycles with a frequency separation of 0.1 megacycle per channel, only eight crystals were required for the total of eighty channels.

The gearing system interconnecting the two tuning controls employed in the invention is the subject of a separate patent application, No. 720,222, filed January 4, 1947, by G. A. Boeck and E. J. Howard, Patent No. 2,479,465 granted August 16, 1949.

Figure 2:
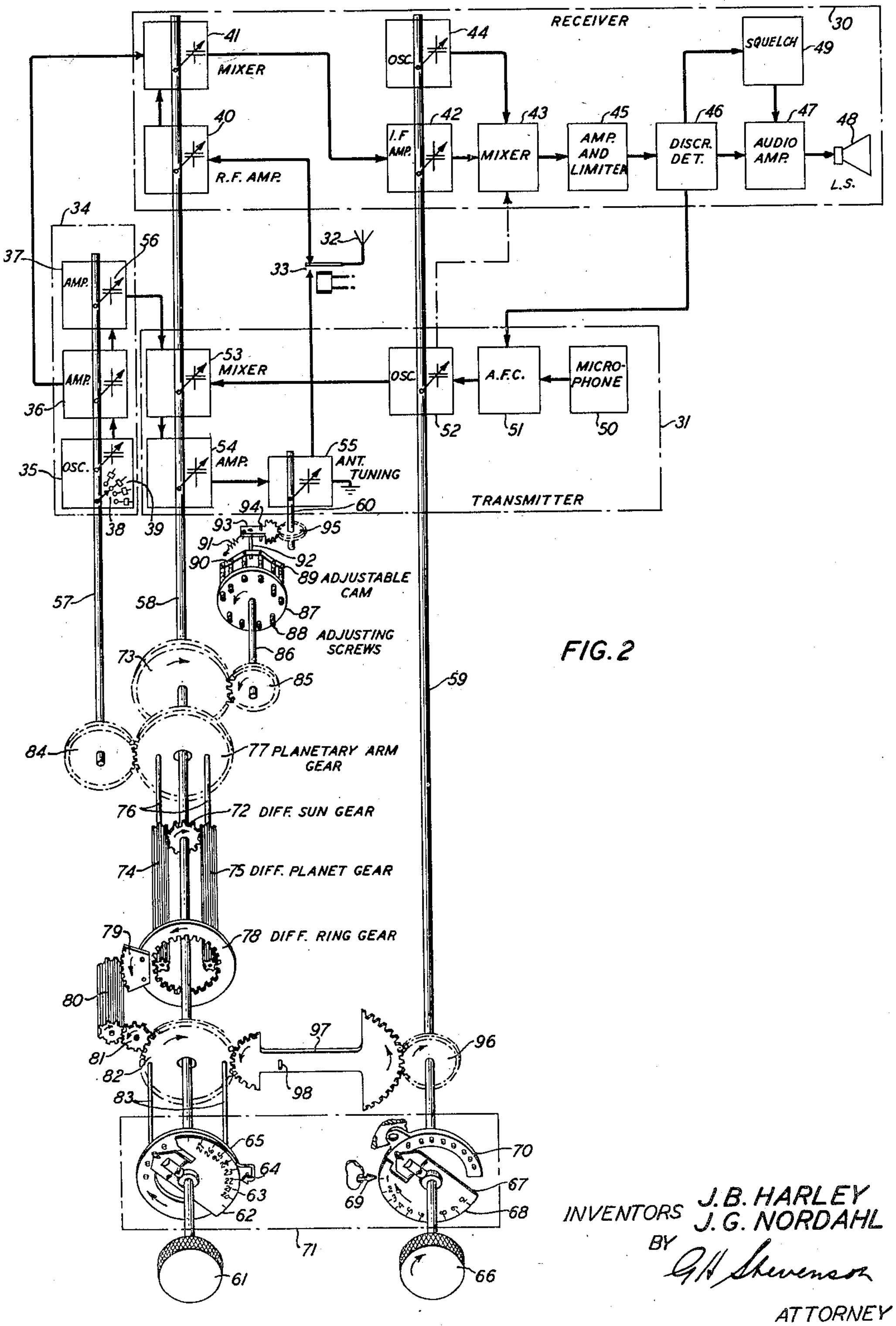

The invention may be more clearly understood from the following detailed description together with the accompanying drawings, of which Fig. 1 is a simplified diagram of one embodiment of the invention, and Fig. 2 is a more detailed representation of another embodiment thereof.

Referring first to Fig. 1, there is shown in block form a combined radio transmitter and receiver system including antenna 1, antenna relay 2, oscillator 3, receiver unit 4 and transmitter unit 5. The receiver unit 4 comprises radio frequency ampifier 6, mixer 7, intermediate frequency amplifier 8, and the audio frequency circuits 9 which include a detector, amplifier and loudspeaker, as indicated. The transmitter unit 5 comprises the audio frequency circuits 10 including a microphone, an amplifier and a modulator as indicated, the oscillator 11, mixer 12, and radio frequency amplifier 13. Lines with arrows connecting the various blocks indicate the direction of energy flow. Oscillators 3 and 11, amplifiers 6, 8 and 13, and mixers 7 and 12 are provided with variable reactance elements for tuning, which, for the purpose of this description, may be taken to be variable condensers capable of adjustment by the rotating shafts 14, 15 and 16. Thus oscillator 3 is tuned by shaft 14, amplifiers 6 and 13 and mixers 7 and 12 by shaft 15, and amplifier 8 and oscillator 11 by shaft 16.

Attached to shaft 14 are control knob 17, detent 18, and bevel gear 19 which engages gear 20 attached to shaft 21. The detent mechanism 18 provides for a rotation of shaft 14 in steps. Attached to shaft 16 are control knob 22 and bevel gear 23 which engages gear 24 attached to shaft 25. Gears 23 and 24 are reduction gears. Shafts 15, 21 and 25 are interconnected by differential gears 26, of proper ratios. The gearing system may be enclosed in a gear box as indicated by 27.

In addition to the tuning elements in oscillator 3, this unit is also provided with a series of frequency-controlling crystals 28, selectable by switch 29 and shaft 14, so that the oscillator frequency is variable in steps in accordance with the detent mechanism 18.

When transmitting, oscillator 11 is modulated by the output of the microphone, amplifier and modulator unit 10 in the usual manner. The modulated output of oscillator 11 is then fed into the transmitter mixer circuit 12, where it is combined with waves from the high frequency oscillator 3 to produce waves of the sum and difference frequencies. Waves of the sum frequency are selected and amplified by the radio frequency amplifier 13 and then delivered to the antenna 1 through the contacts of relay 2.

When the antenna 1 is switched to the receive position, the incoming signal is selected and amplified by the receiver radio-frequency amplifier 6, which is tuned to the same frequency as the transmitter radio frequency amplifier 13 by means of shaft 15. The output of amplifier 6 is combined in the receiver mixer 7 with waves from the high frequency oscillator 3 to produce waves of the sum and difference frequencies. Waves of the difference frequency are selected and amplified by the intermediate frequency amplifier 8, which is tuned to the same frequency as the transmitter oscillator 11 by means of shaft 16. The output of amplifier 8 is then changed to an audible signal by the audio frequency circuits of block 9, viz., the detector, amplifier and loudspeaker.

To tune the set to the desired frequency, shaft 14 is rotated by means of knob 17 to select the proper crystal and tune the associated circuits of oscillator 3. The crystal frequencies are in one-megacycle steps, so that in cooperation with the detent mechanism 18 the rotation of the shaft changes the oscillator frequency in increments of one megacycle. When shaft 14 is rotated it also rotates shaft 15 (but not shaft 16, as explained below) by equal increments through gears 19 and 20 and differential gears 26, so that the tuning of the radio frequency amplifiers 6 and 13 and mixers 7 and 12 is also changed through one-megacycle increments. Thus by turning knob 17 the set may be tuned to the integral megacycle component of the desired frequency. To complete the tuning to the fractional part of a megacycle, shaft 16 is rotated by means of knob 22. The rotation of shaft 16 tunes the intermediate frequency amplifier 8 of the receiver and the low frequency oscillator 11 of the transmitter through a total range of one megacycle, so that by a fractional turn the tuning of these elements may be accomplished. As shaft 16 is rotated it also rotates shaft 15 (but not shaft 14, which is held by detent 18) through reduction gears 23 and 24 and differential gears 26, and thus completes the tuning of the radio frequency amplifiers 6 and 13 and mixers 7 and 12, to the required fraction of a megacycle. Control knob 22 may be provided with a detent similar to detent 18 for facility in rapid tuning to designated increments of frequency, or the detent may be omitted, in accordance with Fig. 1, and shaft 16 left free to be set at any point within its range of motion. Between shafts 16 and 15 there should be sufficient gear reduction and friction to prevent motion being transmitted from shaft 15 to shaft 16, or the latter may be provided with a detent device to hold it in its adjusted position.

Another embodiment of the invention is illustrated in Fig. 2 which shows in some detail the essential elements of a transmitter-receiver set designed for frequency modulation. The electrical apparatus units at the top of the diagram enclosed within the dashed lines 30 are used primarily for reception, while those immediately below, enclosed within the dashed lines 31, are used for transmission. The common antenna 32 may be connected to either the receiver or the transmitter by means of relay 33.

The units enclosed within the dashed lines 34, including blocks 35, 36 and 37, comprise a high frequency beating oscillator which is used for both transmission and reception. Block 35 represents a crystal-controlled vacuum tube oscillator and harmonic generator, and switch 38 is a switch for selecting one of the crystals 39 corresponding to the desired frequency. Blocks 36 and 37 are harmonic amplifiers in tandem for amplifying the output of oscillator 35.

Block 40 in the receiver is a radio frequency amplifier for received waves and block 41 is a first modulator or mixer connected to receive waves from amplifiers 40 and 36. Block 42 is a first intermediate frequency amplifier connected to the output of mixer 41. Block 43 is a second mixer which receives the output of a second beating oscillator 44 and the output of amplifier 42 and delivers waves of the difference frequency to a second intermediate frequency amplifier and limiter unit 45. The output of this unit is delivered to the discriminator-detector 46, the output of which is amplified by audio amplifier 47, which is connected to loudspeaker 48. Block 49 represents a conventional noise amplifier and squelch circuit, the input of which is obtained from discriminator 46 and the output delivered to amplifier 47.

In the transmitter unit 31, block 50 represents a microphone or other audio signal source which is connected through block 51 to modulate the frequency of oscillator 52. Block 51 is a reactance tube control circuit which, in addition to its input signal from the signal circuit 50, receives a direct-current voltage from the output of the receiver discriminator circuit 46 to control the center frequency of oscillator 52, which covers the same range as the first intermediate frequency amplifier 42 of the receiver. The output of oscillator 52 is combined in mixer 53 with waves from harmonic amplifier 37, and waves of the sum frequency are selected and delivered to the radio frequency power amplifier 54. From this amplifier the waves proceed to an antenna tuning unit 55 and thence to antenna 32 via antenna relay 33. When this relay is not energized the antenna is connected to the receiver amplifier 40.

By means of variable reactances certain units of the set in Fig. 2 are tunable, the reactances being represented on the drawing by a variable condenser for simplicity, such, for example, as condenser 56. For purposes of description the tuning of these units may be thought of as being accomplished by the adjustment of such condensers, by means of rotating shafts. Thus shaft 57 tunes the units of the beating oscillator 34, viz., crystal oscillator 35 and harmonic amplifiers 36 and 37. This shaft also operates crystal switch 38, so that the frequency adjustment of the units just mentioned is changed in steps. In like manner shaft 58 tunes mixer 53 and amplifier 54 in the transmitter, and mixer 41 and amplifier 40 in the receiver; shaft 59 tunes oscillator 52 in the transmitter, and oscillator 44 and amplifier 42 in the receiver; and shaft 60 adjusts the antenna tuning unit 55.

To shaft 58 are attached control knob 61 and dial 62, on which is engraved a scale 63. An index or pointer 64 is fixed to the movable detent 65, which engages dial 62 and which may be turned through a small angle and thus rotate shaft 58 as will be presently explained. To shaft 59 are attached control knob 66 and dial 67, on which is engraved a scale 68. Pointer 69 and the detent 70 are fixed to the face plate 71. The detent mechanism allows shaft 59 and dial 67 to rotate only in steps. If desired the detent may be made releasable to enable a dial setting at any intermediate position.

The tuning shafts 57, 58, 59 and 60 are interconnected by a system of gears. As will be explained later, the gearing is so designed that the rotation of shaft 58 when turned by knob 61 rotates shafts 57 and 60 but does not rotate shaft 59, while the rotation of shaft 59 imparts a limited motion to shafts 58 and 60 but does not rotate shaft 57.

Gears 72 and 73 are fixed to shaft 58 and rotate with it. Gear 72 is a differential sun gear which engages the differential planet gears 74 and 75; these rotate about the tie rods 76 which are fixed at one end to the face of the planetary arm gear 77, which rotates about shaft 58. Gears 74 and 75 are meshed with the inner surface of the differential ring gear 78, which has attached to its outer rim the segment gear 79. The latter engages idler gear 80, which in turn engages the reversible idler gear 81, which is meshed with gear 82. The last-named gear is not fixed to shaft 58, so that the shaft can be rotated when gear 82 is stationary. Gear 82 is connected with detent 65 by the tie rods 83 so that these two elements rotate together. In order to simplify the drawing, the supports for the shafts about which gears 80 and 81 rotate are omitted, but may be considered as fixed to the frame of the set. The oscillator drive gear 84, fixed to shaft 57, is meshed with gear 77.

The antenna drive gear 73 attached to shaft 58 engages gear 85 which is fixed to shaft 86. Also fixed to shaft 86 is a circular plate 87 in which are fixed the spaced adjusting screws 88 supporting an adjustable cam 89 composed of a series of links 90. Riding upon this adjustable cam and held in contact therewith by spring 91 is a slider 92 attached to rocker arm and drive gear 93. The latter is pivoted on pin 94 and drives gear 95 attached to shaft 60. Pivot 94 is shown unsupported, to simplify the drawing, but may be considered as being fixed to the frame of the set. Similarly, the end of spring 91 shown free in the drawing is also fixed to the frame.

Gear 96 is fixed to shaft 59 and engages one end of the geared rocker arm 97, which rocks about pivot 98, the support for which, not shown, is fixed to the frame of the set. The other end of the rocker arm is meshed with gear 82. The aforesaid gearing effects a reduction when transmitting motion from shaft 59 to gear 82 and shaft 58.

The radio set shown in Fig. 2 may, for example, cover the frequency range of 20 to 28 megacycles in 0.1-megacycle steps. The rotation of knob 61 causes the frequency of oscillaor 35 and the tuning of amplifiers 40 and 54, mixers 41 and 53, and antenna tuning unit 55 to change in steps of one megacycle, and the rotation of knob 66 causes the frequency of oscillators 52 and 44 and the tuning of amplifier 42 to change in steps of 0.1 megacycle. The rotation of knob 66 also causes a 0.1-megacycle adjustment to be made in the tuning of amplifiers 40 and 54, mixers 41 and 53, and antenna tuning unit 55. Thus by turning the two detented controls 61 and 66 the set can be quickly and accurately tuned, for transmitting or receiving, to any one of eighty channels differing by 0.1 megacycle.

To explain the operation and tuning of the set a specific frequency will be assumed, and its operation as a receiver will be considered first. Let $F=F_1+F_2$ represent any incoming frequency in the operating range of the equipment (20 to 28 megacycles), were $F_1$ and $F_2$ represent the integral and decimal portions of F, respectively. Taking F as 22.1 megacycles, for illustration, the high frequency control knob 61 is turned to set dial 62 at 22 ($=F_1$), as indicated by pointer 64, and the low frequency knob 66 is turned to set dial 67 at .1 ($=F_2$), as indicated by the fixed pointer 69. The same dial settings will also provide for transmission at the frequency 22.1 megacycles.

When control knob 61 is turned to 22 megacycles, the tuning condensers of receiver amplifier 40 and mixer 41 and transmitter amplifier 54 and mixer 53 are adjusted directly by shaft 58 and tuned to a frequency of 22 megacycles. Since the low frequency control knob 66 (and shaft 59) is held stationary by the detent mechanism 70 while control knob 61 is being turned, gear 82 and hence ring gear 78 cannot turn. With ring gear 78 stationary, the planet gears 74 and 75 rotate around the inside of ring gear 78 due to the motion of the differential sun gear 72, which is fixed to shaft 58. The planet gears 74 and 75 impart motion to gear 77 through the tie rods 76 and thence to shaft 57 through gear 84. By rotation of shaft 57 the proper crystal is selected by crystal switch 38 and the tuning elements of the beating oscillator unit 34 are tuned to the proper frequency.

When the low frequency control knob 66 is turned to .1 megacycle on dial 67, the high frequency knob 61 is held in the 22-megacycle position by detent 65. Motion of the low frequency shaft 59 is imparted to gear 82 through the drive gear 96 and rocker arm 97. Through the tie rods 83 the rotation of gear 82 is imparted directly to the shell of the detent mechanism 65 on shaft 58. Since this detent mechanism is partially locked to shaft 58 through the detent arm of dial 62, shaft 58 is rotated through a small number of degrees and the condenser plates of the tuned circuits associated with shaft 58 are turned through an arc proportional to the frequency change imparted by the motion of the low frequency knob 66. These circuits are amplifiers 40 and 54, mixers 41 and 53, and the antenna tuning unit 55, which are now tuned by this operation to 22.1 megacycles.

Since the frequency setting of the high frequency oscillator 34 must remain fixed except as changed (in steps of one megacycle) by the high frequency knob 61, it is necessary to provide that the turning of the low frequency knob 66 does not alter this setting by rotating shaft 57. To this end the gear ratio of the idler gears 80 and 81 is selected so that any motion imparted to the differential ring gear 78 by gears 82, 81 and 80 will exactly equal the motion imparted to it by the planet gears 74 and 75 due to the rotation of sun gear 72. As a result, the planet gears 74 and 75 will simply rotate about their shafts without imparting any motion to gear 77 through the tie rods 76, and hence no motion will be transmitted from knob 66 and shaft 59 to shaft 57.

When the antenna relay 33 is not energized, the antenna 32 is connected for reception. A signal received by antenna 32 is amplified by the tuned radio frequency amplifier 40. The output of this amplifier is fed into the first mixer 41 where it is combined with the output of harmonic amplifier 36 of the high frequency oscillator unit 34 to produce a variable intermediate frequency. As previously stated, the high frequency mixing oscillator waves are obtained from a quartz crystal oscillator and a harmonic generator. Due to a limitation in the frequency range covered by highly stable quartz crystal oscillators, a crystal oscillator frequency was chosen which is a submultiple of the frequency desired for the beating oscillator. The proper crystal is selected by crystal switch 38, operated by shaft 57. The desired harmonic of the crystal oscillator output is selected by the tuned harmonic amplifier 36, the tuning of which is also controlled by shaft 57. This amplifier covers the frequency range from 15.55 to 22.55 megacycles, in steps of one megacycle. When dial 62 is turned to 22 megacycles, the harmonic amplifier will be tuned to 17.55 megacycles. The output of amplifier 36 is used for reception, but when the equipment is being used for transmission an additional amplifier 37 is provided, since in this case a higher mixing voltage is desirable.

The output frequency of the receiver mixer 41 is the difference between the incoming carrier frequency of 22.1 megacycles and the harmonic output frequency of 17.55 megacycles, or 4.55 megacycles. The 4.55-megacycle signal is amplified by the tuned intermediate frequency amplifier 42, which may be tuned over a frequency range from 4.45 to 5.45 megacycles. In order to obtain a greater degree of selectivity than could be achieved in a tuned intermediate frequency amplifier of a relatively small number of tuned circuits, the variable intermediate frequency is heterodyned down to a lower frequency for amplification in a fixed-tuned intermediate frequency amplifier in the following manner, as shown in the drawing (Fig. 2). The beating oscillator 44, tuned by knob 66 and shaft 59, covers the frequency range from 3.05 to 4.05 megacycles, and is tuned in this particular case to 3.15 megacycles when the low frequency dial is set at .1. The 3.15-megacycle output of oscillator 44 is combined with the 4.55-megacycle output of amplifier 42 in mixer 43 to produce a fixed intermediate frequency of 1.4 megacycles, which is amplified and limited by the fixed-tuned narrow band-pass amplifier and limiter unit 45. The output of this unit is converted to an audio frequency by a suitable detector circuit, which in this case is the discriminator circuit 46 designed for frequency modulated signals. The output of the discriminator is fed into audio amplifier 47 and thence into the loudspeaker 48. The noise amplifier and squelch circuit 49, which is of conventional design, cuts off the audio amplifier when no signal is being received.

When the antenna relay 33 is energized, the antenna 32 is connected for transmission. During transmission, the direct-current component of the output of the discriminator circuit 46, the magnitude of which is a function of the frequency difference between the intermediate frequency signal and the center frequency of the discriminator circuit, is applied to the reactance tubes of the automatic frequency-control circuit 51 to correct the frequency of the low-frequency transmitter oscillator 52. Since this oscillator is also covering the same frequency range as the intermediate frequency amplifier 42 of the receiver, the output of oscillator 52 is picked up through stray coupling by mixer 43 and amplifier 45 (represented in the drawing by the dashed line connecting oscillator 52 and mixer 43), which are left connected during transmission to operate the automatic frequency control circuit 51. The second receiver oscillator 44 and the discriminator circuit 46 in this way determine the frequency of transmission and reception rather than the less stable transmitter oscillator 52. The transmitter oscillator 52 is modulated by the same reactance tube control circuit 51 by a suitable connection of microphone 50. The output of oscillator 52, which covers the frequency range from 4.45 to 5.45 megacycles, and which in the assumed case is 4.55 megacycles, is fed to the transmitter mixer 53.

In mixer 53 the 4.55-megacycle signal is combined with the 17.55-megacycle output of the harmonic amplifier 37, producing the desired carrier frequency of 22.1 megacycles. The output of the mixer is then amplified by the high frequency power amplifier 54. Since the output circuit of the transmitter must be accurately tuned to avoid loss in power, it is necessary to provide means for compensating for the impedance variations in the antenna circuit due to a change in frequency. This is accomplished by driving the antenna tuning condenser in unit 55 from shaft 58 through a motion imparted through slider 92 riding on the surface of the adjustable cam 89. The adjusting screws 88 supporting the links composing the cam are spaced at intervals corresponding to a frequency change of one megacycle, and are adjusted to properly tune the antenna by the motion transmitted to condenser shaft 60. The output of amplifier 54 is delivered to the antenna tuning unit 55, whence it is passed to antenna 32 via relay 33.

It is to be understood that the above-described arrangements are illustrative of the application of the principles of the invention. Other arrangements may be devised by those skilled in the art without departing from the spirit and scope of the invention.

What is claimed is:

1. In a combined radio transmitter and receiver arranged for transmission and reception of signals on carrier waves of the same frequency, a high frequency oscillator the frequency of which is adjustable in steps, a continuously variable low frequency oscillator, a first modulator for combining the waves from said oscillators to produce a transmitter wave of the sum frequency, and a first high frequency amplifier for amplifying said transmitter waves; a receiving circuit comprising a second high frequency amplifier, a second modulator for combining waves from said high frequency oscillator with the received waves to produce waves of the difference frequency, and an intermediate frequency amplifier for amplifying said difference frequency waves; individual tuning means for each of said oscillators, modulators and amplifiers, a first common tuning control for simultaneously tuning said first and second high frequency amplifiers to the same frequency and said high frequency oscillator to another frequency, said control being adjustable in steps, a second common tuning control for simultaneously tuning said low frequency oscillator and said intermediate frequency amplifier to the same frequency, the frequency range of said second control being equal to one step of the said first control, and gearing means coupling said first and second controls for imparting a fine adjustment to said first and second high frequency amplifiers by the operation of said second control without disturbing the adjustment of said high frequency oscillator, said second control being unaffected by the operation of said first control.

2. In a combined radio transmitter and receiver arranged for transmission and reception of signals on carrier waves of the same frequency, a high frequency oscillator the frequency of which is adjustable in steps, a continuously variable low frequency oscillator, a first modulator for combining the waves from said oscillators to produce a transmitter wave of the sum frequency, and a first high frequency amplifier for amplifying said transmitter waves; a receiving circuit comprising a second high frequency amplifier, a second modulator for combining waves from said high frequency oscillator with the received waves to produce waves of the difference frequency, and an intermediate frequency amplifier for amplifying said difference frequency waves; individual tuning means for each of said oscillators, modulators and amplifiers; a coarse and fine two-adjustment frequency control device for simultaneously tuning said transmitter and receiver to the same frequency, said device comprising a first rotatable shaft for the control of said tuning means for said high frequency oscillator, a second rotatable shaft for the common control of said individual tuning means for said modulators and high frequency amplifiers, a first control knob fixed to said second shaft for rotating same, detent means enabling said second shaft to be rotated in steps and the frequency of said modulators and high frequency amplifiers to be adjusted in accordance with said steps, said detent means being rotatably supported on said second shaft and having a part secured to same, a planetary gear means supported on said second shaft and forming a power transmission means between said second shaft and said first shaft for the adjustment of said high frequency oscillator according to said steps, a third rotatable shaft for the common control of said individual tuning means for said low frequency oscillator and said intermediate frequency amplifier, the complete range of rotation of said third shaft causing a change in frequency of said last-mentioned oscillator and amplifier equal to one of said steps, a second control knob fixed to said third shaft for rotating same, gear means comprising a rocker arm forming a power transmitting means between said third shaft and said detent means to transmit rotations of said third shaft to said second shaft, the gear ratio being such that the rotation of said third shaft through its entire range causes a change in frequency of said modulators and high frequency amplifiers equal to one of said steps, and holding means for said third shaft to prevent rotation of same by the rotation of said second shaft.

3. In a combined radio transmitter and receiver arranged for transmission and reception of signals on carrier waves of the same frequency, a high frequency oscillator the frequency of which is adjustable in steps, a continuously variable low frequency oscillator, a first modulator for combining the waves from said oscillators to produce a transmitter wave of the sum frequency, and a first high frequency amplifier for amplifying said transmitter waves; a receiving circuit comprising a second high frequency amplifier, a second modulator for combining waves from said high frequency oscillator with the received waves to produce waves of the difference frequency, and an intermediate frequency amplifier for amplifying said difference frequency waves; individual tuning means for each of said oscillators, modulators and amplifiers; a first rotatable shaft for the control of said tuning means for said high frequency oscillator, a second rotatable shaft for the common control of said individual tuning means for said modulators and high frequency amplifiers, a first control knob for rotating said second shaft, detent means rotatably supported on said second shaft and having a first part secured to said second shaft, a third rotatable shaft for the common control of said individual tuning means for said low frequency oscillator and said intermediate frequency amplifier, and a second control knob for rotating said third shaft; gearing means coupling said first, second and third shafts whereby the rotation of said second shaft by turning said first control knob transmits rotation to said first shaft but not to said third shaft, and the rotation of said third shaft by turning said second control knob transmits a lesser rotation to said second shaft but no rotation to said first shaft, said gearing means comprising a sun gear secured to said second shaft, a ring gear rotatable relative to said sun gear, paired planet gears in mesh with said sun gear and said ring gear, a first plate gear carried on said paired planet gears and in driving connection with said first shaft, a segment gear secured to said ring gear, a second plate gear carried on a second part of said detent means, a train of two idler gears interconnecting said second plate gear and said segment gear, a rocker arm in gear connection with said third shaft and said second plate gear and operable to rotate said second plate gear and to hold said plate gear against rotation by the rotation of said second shaft.

JOHN B. HARLEY.
JOHN G. NORDAHL.

REFERENCES CITED

The following references are of record in the file of this patent:

UNITED STATES PATENTS

| Number | Name | Date |
|---|---|---|
| 2,419,593 | Robinson | Apr. 29, 1947 |
| 2,433,290 | Mitchell et al. | Dec. 23, 1947 |
| 2,452,601 | Ranger | Nov. 2, 1948 |